US008699038B2

(12) United States Patent
Schoenleber et al.

(10) Patent No.: US 8,699,038 B2
(45) Date of Patent: Apr. 15, 2014

(54) APPARATUS AND METHOD FOR MONITORING A THICKNESS OF A SILICON WAFER WITH A HIGHLY DOPED LAYER

(75) Inventors: Martin Schoenleber, Aschaffenburg (DE); Christoph Dietz, Obertshausen (DE)

(73) Assignee: Precitec Optronik GmbH, Neu-Isenburg (DE)

( * ) Notice: Subject to any disclaimer, the term of this patent is extended or adjusted under 35 U.S.C. 154(b) by 349 days.

(21) Appl. No.: 13/046,063

(22) Filed: Mar. 11, 2011

(65) Prior Publication Data
US 2011/0261371 A1    Oct. 27, 2011

(30) Foreign Application Priority Data

Mar. 12, 2010  (GB) ................................ 1004116.8

(51) Int. Cl.
*G01B 11/28*    (2006.01)
(52) U.S. Cl.
USPC ............... 356/630; 356/237.2; 356/237.5; 438/8
(58) Field of Classification Search
USPC .................. 356/630, 237.2–237.5; 438/8
See application file for complete search history.

(56) References Cited

U.S. PATENT DOCUMENTS

| 6,368,881 | B1* | 4/2002 | Brouillette et al. ............... 438/7 |
| 6,567,172 | B1  | 5/2003 | Hobbs et al. |
| 7,233,401 | B1* | 6/2007 | Houser ............................ 356/503 |
| 7,271,916 | B2  | 9/2007 | Jasapara et al. |
| 7,278,903 | B2  | 10/2007 | Masuda |
| 7,485,892 | B2  | 2/2009 | Ooi et al. |
| 7,534,666 | B2  | 5/2009 | Francis et al. |
| 7,561,607 | B2  | 7/2009 | Kovsh et al. |
| 2002/0173084 | A1 | 11/2002 | Ohkawa |
| 2003/0090671 | A1* | 5/2003 | Takahashi et al. ............ 356/479 |
| 2007/0020784 | A1* | 1/2007 | Timans .......................... 438/16 |

(Continued)

FOREIGN PATENT DOCUMENTS

DE    10 2007 048 295    4/2009
EP    1 296 367 A1    3/2003

(Continued)

OTHER PUBLICATIONS

Falk, Aaron R.: "Backside Thermal Mapping Using Active Laser Probe," Electronic Device Failure Analysis News, May 2000, pp. 1-7; Electronic Device Failure Analysis Society, US.

(Continued)

*Primary Examiner* — Tarifur Chowdhury
*Assistant Examiner* — Isiaka Akanbi

(57) ABSTRACT

Apparatus for monitoring a thickness of a silicon wafer with a highly-doped layer at least at a backside of the silicon wafer is provided. The apparatus has a source configured to emit coherent light of multiple, wavelengths. Moreover, the apparatus comprises a measuring head configured to be contactlessly positioned adjacent the silicon wafer and configured to illuminate at least a portion of the silicon wafer with the coherent light and to receive at least a portion of radiation reflected by the silicon wafer. Additionally, the apparatus comprises a spectrometer, a beam splitter and an evaluation device. The evaluation device is configured to determine a thickness of the silicon wafer by analyzing the radiation reflected by the silicon wafer by an optical coherence tomography process. The coherent light is emitted multiple wavelengths in a bandwidth b around a central wavelength $w_c$.

37 Claims, 2 Drawing Sheets

(56) References Cited

U.S. PATENT DOCUMENTS

2007/0258095 A1* 11/2007 Olivier et al. ............... 356/479
2008/0020495 A1   1/2008 Usui et al.
2009/0268209 A1   10/2009 Waelti et al.

FOREIGN PATENT DOCUMENTS

| EP | 2 138 826 A1 | 12/2009 |
| EP | 2 144 034 A1 | 1/2010 |
| WO | WO 03/081293 A2 | 10/2003 |
| WO | WO 2009/013231 A1 | 1/2009 |
| WO | WO 2009/140617 A2 | 11/2009 |

OTHER PUBLICATIONS

Falk, Aaron R.; "Near IR Absorption in Heavily Doped Silicon—An Empiral Approach," no month, 2000, pp. 1-7; OptoMetrix, Inc., Renton, Washington, US.

Barkhordarian, Vrej: "Power MOSFET Basics:" known to be published at last as eary as Mar. 12, 1020; pp. 1-13; http://www.irf.com; International Rectifier; California, US.

* cited by examiner

APPARATUS AND METHOD FOR MONITORING A THICKNESS OF A SILICON WAFER WITH A HIGHLY DOPED LAYER

CROSS REFERENCE TO RELATED APPLICATIONS

This application claims the benefit of the filing date of a Great Britain patent application, serial number GB 1004116.8, filed on Mar. 12, 2010, the disclosure of which is incorporated herein by reference for all purposes.

TECHNICAL FIELD

The invention relates in general to an apparatus and a method for monitoring a thickness of a silicon wafer, in particular a silicon wafer with a highly-doped layer at least at a backside of the silicon wafer, and an apparatus for thinning a silicon wafer.

BACKGROUND INFORMATION

A method and apparatus for controlling the thickness of a semiconductor wafer during a backside grinding process are disclosed in U.S. Pat. No. 6,368,881B1. Optical measurements of the wafer thickness during a backside grinding process are used to determine the endpoint of the grinding process. Furthermore, the method may be used to determine if wedging of the semiconductor occurs and, if wedging does occur, to provide leveling information to the thinning apparatus such that a grinding surface can be adjusted to reduce or eliminate wedging.

However, it is believed that this method and apparatus are not suitable to reliably measure wafer thicknesses for silicon wafers with a highly-doped silicon layer on the backside of the silicon wafer due to a low-contrast interference signal.

It is therefore desirable to provide apparatus and a method for monitoring a thickness of a silicon wafer with a highly-doped layer at least at a backside of the silicon wafer, which provide a sufficiently high-contrast interference signal.

SUMMARY

In response to these and other problems, in one embodiment, there is disclosed an apparatus for monitoring a thickness of a silicon wafer with a highly-doped silicon layer at least at a backside of the silicon wafer.

In other embodiments, there is disclosed an apparatus for thinning a silicon wafer and to advantageously determine the thickness of the silicon wafer with high accuracy.

In yet other embodiments, there is disclosed a method for monitoring a thickness of a silicon wafer with a highly-doped silicon layer on at least at a backside of the silicon wafer.

These and other features, and advantages, will be more clearly understood from the following detailed description taken in conjunction with the accompanying drawings. It is important to note the drawings are not intended to represent the only aspect of the invention.

Although the drawings are intended to illustrate one embodiment of the present invention, the drawings are not necessarily drawn to scale.

DETAILED DESCRIPTION

Specific examples of components, signals, messages, protocols, and arrangements are described below to simplify the present disclosure. These are, of course, merely examples and are not intended to limit the invention from that described in the claims. Well known elements are presented without detailed description in order not to obscure the present invention in unnecessary detail. For the most part, details unnecessary to obtain a complete understanding of the present invention have been omitted inasmuch as such details are within the skills of persons of ordinary skill in the relevant art. Details regarding control circuitry or mechanisms used to control the rotation of the various elements described herein are omitted, as such control circuits are within the skills of persons of ordinary skill in the relevant art.

Figure 1:
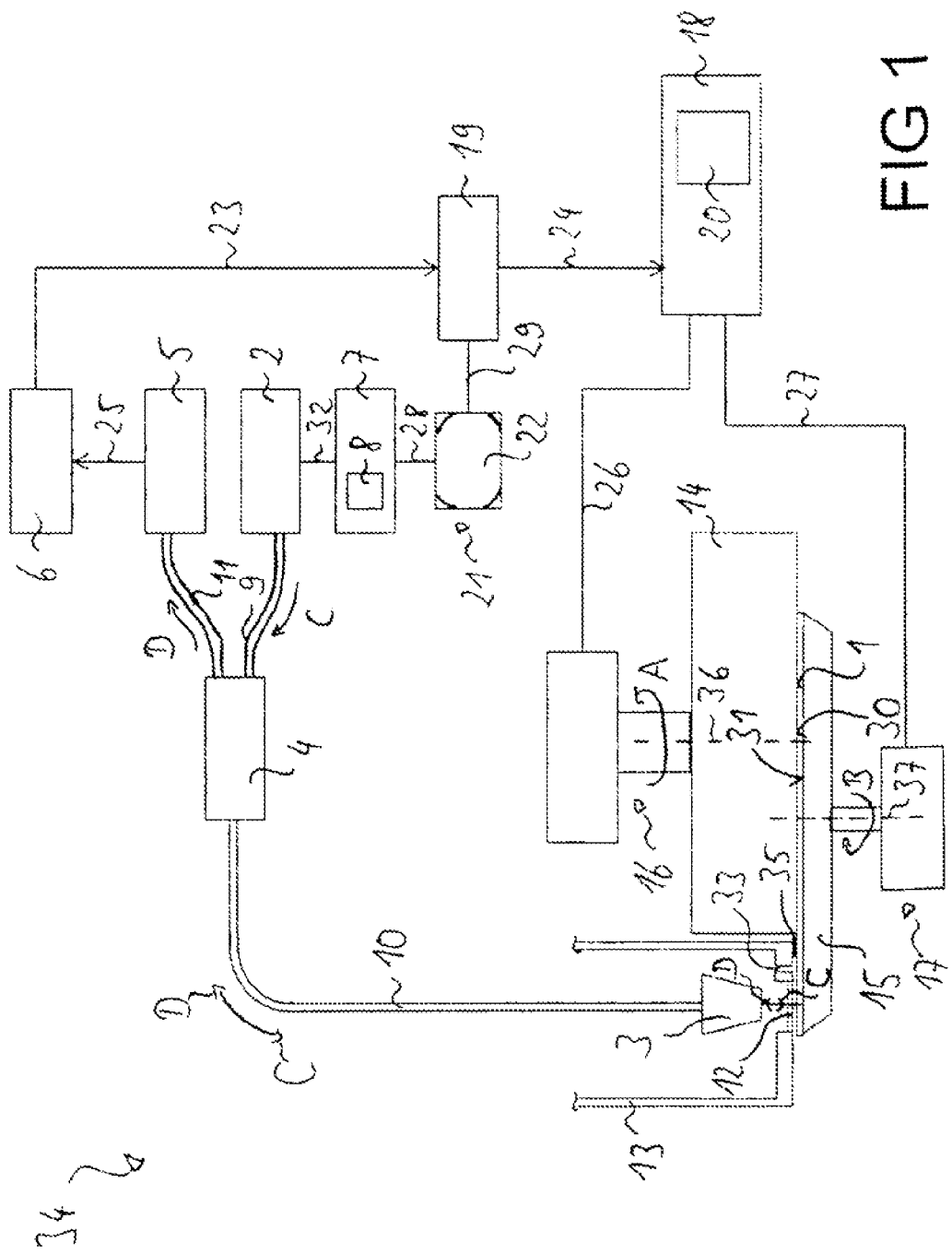
FIG. 1. is a schematic view illustrating an apparatus for thinning a silicon wafer according to one embodiment of the invention.

Turning now to FIG. 1, there is presented one embodiment apparatus 34 for thinning a silicon wafer 1 according to an embodiment of the invention. The silicon wafer 1 comprises a highly-doped layer (not shown) at least at a backside 30 of the silicon wafer 1.

The apparatus 34 comprises a system for removing at least a portion of the backside 30 of the silicon wafer 1 and apparatus for monitoring a thickness of the silicon wafer 1, in particular during a backside grinding process.

The system for removing comprises a grinding wheel 14 and a plate 15, wherein the plate 15 is configured to retain the silicon wafer 1 for example by means of a chuck (not shown). The grinding wheel 14 is rotatable about its own rotational axis 36 as schematically illustrated by an arrow A and the plate 15 is rotatable about its own rotational axis 37 as schematically illustrated by an arrow B. A motor 16 drives the rotatable grinding wheel 14 and a motor 17 drives the rotatable plate 15.

The apparatus for monitoring the thickness of the silicon wafer 1 comprises a measuring head 3, which is arranged contactlessly adjacent the backside 30 of the silicon wafer 1. Moreover, the apparatus for monitoring comprises a light source 2 which is a spectral broadband light source or a tunable laser source configured to emit coherent light at multiple wavelengths around a central wavelength $w_c$ in a near infrared region in a bandwidth b of several tens of nanometers to about 100 nanometers. The light source 2 may be tunable by means of an oscillating micromechanics.

The spectral broadband light source may be selected from the group consisting of a light-emitting diode, a semiconductor superluminescent diode (SLD) and an optically pumped fiber based amplified spontaneous emission (ASE) source, and the tunable laser source may be selected from the group consisting of an optically pumped photonic crystal laser and a semiconductor quantum dot tunable laser.

The measuring head 3 is configured to illuminate at least a portion of the silicon wafer 1, in particular the backside 30, with the coherent light of multiple wavelengths of the light source 2 and to receive at least a portion of radiation reflected by the silicon wafer 1, in particular by the backside 30 of the silicon wafer 1 and by a front side 31 of the silicon wafer 1, wherein the front side 31 is opposite to the backside 30. This is illustrated schematically by arrows C and D in FIG. 1.

The measuring head 3 is arranged in a housing 13 of the apparatus for monitoring. Coherent light of the light source 2 and at least a part of the reflected radiation pass through a window 12 of the housing 13, wherein the window 12 is transparent for the light of the light source 2. In the illustrated embodiment, the window 12 is transparent for infrared light.

The housing 13 is preferably waterproof and further comprises an injection port 33. The injection port 33 is connected to a water tube (not shown) and/or a compressed air tube (not shown). Water and/or compressed air (not shown) injected into the injection port 33 may run through a channel 35, the channel 35 being essentially a part of the space between the housing 13 and the backside 30 of the silicon wafer 1, and remove grinding debris. This may prevent measurement errors for the thickness measurement caused by the grinding debris. Furthermore, in the case of water, the water may help to couple light between the window 12 and the silicon wafer 1.

The measuring head 3 is coupled to a beam splitter which in the illustrated embodiment is an optical coupler 4 of the apparatus for monitoring by a first optical waveguide 10. The optical coupler 4 couples the light source 2 by the first optical waveguide 10 and a second optical waveguide 9 coupling the optical coupler 4 to the light source 2 to the measuring head 3 and coherent light of the light source 2 is provided to the measuring head 3 via the second optical waveguide 9, the optical coupler 4 and the first optical waveguide 10. The reflected radiation is provided to a spectrometer 5 of the apparatus for monitoring via the fist optical waveguide 10, and a third optical waveguide 11 coupling the optical coupler 4 to the spectrometer 5. Partial intensities $I(\lambda)$ of the reflected radiation are measured as a function of the wavelengths $\lambda$ with an array of photodetectors (not shown) in the spectrometer and a spectrum of the measured partial intensities $I(\lambda)$ is generated. The spectrum is provided to an evaluation device 6 via a signal line 25 which couples the spectrometer 5 to the evaluation device 6.

In the illustrated embodiment, the evaluation device 6 continuously determines the thickness of the silicon wafer 1 using a FD OCT process which may be a 1D-se FD OCT process or a 1D-te FD OCT process. The determined thicknesses are then provided via a signal line 23 to a coupling unit 19.

The coupling unit 19 is connected to a monitor 21 by a signal line 29. The determined thicknesses of the silicon wafer 1 may be displayed on the monitor 21. In the illustrated embodiment, the monitor 21 comprises a touch screen 22. Via the touch screen 22, a predetermined thickness for the thickness of the silicon wafer 1 may be set. The value of the predetermined thickness is provided via the signal line 29, the coupling unit 19 and a signal line 24 to a control unit 18 for the system for removing, the signal line 24 coupling the coupling unit 19 to the control unit 18. The control unit 18 is configured to halt the system for removing when the determined thickness of the silicon wafer 1 reaches the predetermined thickness. This may be achieved by providing an according signal to the motor 16 of the grinding wheel 14 via a control line 26 and an according signal to the motor 17 of the plate 15 via a control line 27, the control line 26 coupling the motor 16 to the control unit 18 and the control line 27 coupling the motor 17 to the control unit 18.

The control unit 18 comprises a controller 20 configured to adjust the rotation speed of the rotatable plate 15 and the rotatable grinding wheel 14 depending on the determined thickness of the silicon wafer 1. This may be achieved by providing according control signals to the motor 16 of the rotatable grinding wheel 14 via the control line 26 and to the motor 17 of the rotatable plate 15 via the control line 27.

The apparatus for monitoring further comprises a selection device 7. A dopant concentration of the highly-doped layer of the silicon wafer 1 may be input via the touch screen 22 of the monitor 21 and may be provided to the selection device 7 via a signal line 28 coupling the monitor 21 to the selection device 7. The selection device 7 is configured to select the central wavelength $w_c$ to be a wavelength for which an optical absorption coefficient of the highly-doped layer of the silicon wafer 1 having the input dopant concentration is a minimum. In the illustrated embodiment, the selection device 7 comprises a storage device 8 with stored data of a dependence of the absorption coefficient on the dopant concentration. The selection device 7 is configured to select the central wavelength $w_c$ using the data stored in the storage device.

In the illustrated embodiment, the highly-doped layer of the silicon wafer 1 comprises silicon with a dopant concentration N, wherein $1*10^{19}$ cm$^{-3}$ ≤ N ≤ $1*10^{21}$ cm$^{-3}$. The highly-doped layer of the silicon wafer 1 may be of n$^+$-type conduction or of p$^+$-type conduction.

Figure 2:
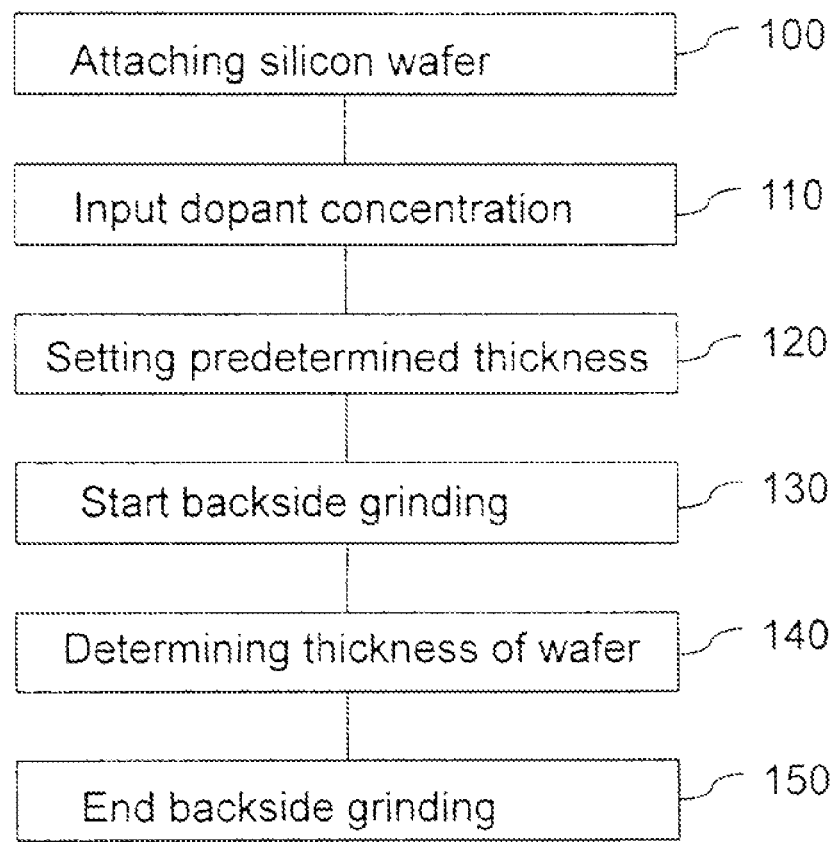
FIG. 2 is a flow chart illustrating a method for thinning a silicon wafer according to one embodiment of the invention.

FIG. 2 illustrates a flow chart of a method for thinning a silicon wafer according to an embodiment of the invention.

In a step 100, a silicon wafer is attached to an apparatus for thinning according to one of the embodiments mentioned above. In a step 110, a dopant concentration of the highly-doped layer of the silicon wafer is inputted.

In a step 120, a predetermined thickness for the thickness of the silicon wafer is set and in a step 130, the process of removing at least a portion of a backside of the silicon wafer is started.

In a step 140, the process of illuminating at least a portion of the silicon wafer with coherent light of a spectral broadband light source or a tunable laser source, receiving at least a portion of radiation reflected by the silicon wafer and determining a thickness of the silicon wafer by analyzing the radiation reflected by the silicon wafer using a process selected from the group consisting of a 1D-se FD OCT process, a 1D-te FD OCT process, a 1D-se TD OCT process and a 1D-te TD OCT process is initiated. The spectral broadband light source or the tunable laser source emits coherent light at multiple wavelengths in a bandwidth b around a central wavelength $w_c$, wherein a wavelength for which an optical absorption coefficient of the highly-doped layer of the silicon wafer having the input dopant concentration is a minimum lies within the bandwidth b.

In a step 150, the removing step is stopped when the determined thickness of the silicon wafer reaches the predetermined thickness.

The foregoing description of the embodiments of the invention has been presented for the purposes of illustration and description. It is not intended to be exhaustive or to limit the invention to the precise form disclosed. Many combinations, modifications and variations are possible in light of the above teaching. For instance, in certain embodiments, each of the above described components and features may be individually or sequentially combined with other components or features and still be within the scope of the present invention. Undescribed embodiments which have interchanged components are still within the scope of the present invention. It is intended that the scope of the invention be limited not by this detailed description, but rather by the claims.

For instance, some embodiments may provide for an apparatus for monitoring a thickness of a silicon wafer with a highly-doped silicon layer at least at a backside of the silicon wafer.

The highly-doped silicon layer at the backside of the silicon wafer may extend from the outermost surface of the backside into the body of the silicon wafer or may be arranged in a near surface region of the backside entirely within the body of the silicon wafer.

In an embodiment, the highly-doped silicon layer may also extend laterally over the entire backside of the silicon wafer in addition to extending from the outermost surface of the backside into the body of the silicon wafer or being arranged in a near surface region of the backside entirely within the body of the silicon wafer. The high-doped silicon layer may form part of a contact for a device structure positioned within the silicon wafer. For example, the high-doped layer may form part of a drain contact for a vertical transistor such as a MOSFET (Metal Oxide Semiconductor Field Effect Transistor).

The apparatus comprises a light source configured to emit coherent light at multiple wavelengths. Moreover, the apparatus comprises a measuring head configured to be contactlessly positioned adjacent the silicon wafer comprising the backside from which at least a portion is to be removed and configured to illuminate at least a portion of the silicon wafer with the coherent light of multiple wavelengths and configured to receive at least a portion of radiation reflected by the silicon wafer. The measuring head may be positioned adjacent the backside of the silicon wafer or adjacent a front side of the silicon wafer being opposite to the backside. Additionally, the apparatus comprises a spectrometer configured to receive at least a portion of the radiation reflected by the silicon wafer and measure the partial intensities of the radiation reflected by the silicon wafer as a function of wavelength, a beam splitter coupled to the measuring head, the light source and the spectrometer for guiding the coherent light of multiple wavelengths to the measuring head and the received radiation to the spectrometer and an evaluation device. The evaluation device is configured to determine a thickness of the silicon wafer by analyzing the radiation reflected by the silicon wafer using an optical coherence tomography process. The light source is configured to emit coherent light at multiple wavelengths with a bandwidth b around a central wavelength $w_c$, wherein the bandwidth b has limits that are defined such that a wavelength for which an optical absorption coefficient of the highly-doped layer of the silicon wafer is a minimum lies within the bandwidth b.

The apparatus for monitoring according to the present invention may provide light which passed through the silicon wafer and is reflected by a second surface of the silicon wafer with an intensity sufficiently high to produce a high-contrast interference signal with the light reflected by the first surface of the silicon wafer which is closer to the measuring head than the second surface by including a wavelength for which the optical absorption coefficient of the highly-doped layer of the silicon wafer is a minimum within the bandwidth b. The optical absorption coefficient for highly-doped silicon increases significantly with increasing dopant concentration. Including the wavelength for which the optical absorption coefficient of the highly-doped layer of the silicon wafer is a minimum is thus of particular advantage. The apparatus thus provides a reliable monitoring of the thickness of silicon wafers with a highly-doped silicon layer at least at the backside, in particular for silicon wafers with thicknesses above 50 µm.

In an embodiment, the bandwidth b has limits that are defined such that the central wavelength $w_c$ is the wavelength for which an optical absorption coefficient of the highly-doped layer of the silicon wafer is a minimum. This may enhance the intensity of the light which passed through the silicon wafer further, since the central wavelength $w_c$ is emitted with the highest intensity within the bandwidth b.

In a further embodiment, the apparatus is an in-situ backside grinding process apparatus for monitoring a thickness of the silicon wafer with the highly-doped silicon layer at least at the backside of the silicon wafer during a backside grinding process and the evaluation device is configured to determine the thickness of the silicon wafer by analyzing the radiation reflected by the silicon wafer at least during the backside grinding process. This embodiment advantageously provides a backside grinding process monitor, which reliably measures the thickness of the silicon wafer during a backside grinding process with high accuracy. Reducing the thickness of silicon wafers is of particular importance for silicon wafers which are intended to be divided into plural semiconductor chips with integrated circuits in order to improve lightness and compactness of the semiconductor chips and to reduce the on-state resistance of the semiconductor device, for instance of a power semiconductor device.

The apparatus may further comprise an input device for inputting a dopant concentration of the highly-doped layer of the silicon wafer and may be configured to select the central wavelength $w_c$ to be the wavelength for which the optical absorption coefficient of the highly-doped layer of the silicon wafer having the inputted dopant concentration is a minimum.

The apparatus may further comprise a storage device with stored data of a dependence of the absorption coefficient of silicon on the dopant concentration and may be configured to select the central wavelength $w_c$ using the data stored in the storage device.

In a further embodiment, the central wavelength $w_c$ fulfills the relation 950 nm≤$w_c$≤1150 nm. For said wavelengths, the optical absorption coefficient may be minimal for a dopant concentration N of the highly-doped layer of the silicon wafer, wherein $1*10^{19}$ cm$^{-3}$≤N≤$1*10^{21}$ cm$^{-3}$.

The light source may be a spectral broadband light source or a tunable laser source.

The spectral broadband light source may be selected from the group consisting of a light-emitting diode, a semiconductor superluminescent diode (SLD) and an optically pumped fiber based amplified spontaneous emission (ASE) source, and the tunable laser source may be selected from the group consisting of an optically pumped photonic crystal laser and a semiconductor quantum dot tunable laser.

In a further embodiment, the beam splitter is an optical coupler. The apparatus for monitoring may further comprise at least one first optical waveguide, the at least one first optical waveguide coupling the measuring head to the optical coupler, at least one second optical waveguide, the at least one second optical waveguide coupling the optical coupler to the light source, and at least one third optical waveguide, the at least one third optical waveguide coupling the optical coupler to the spectrometer.

The optical coherence tomography process used to determine the thickness may be selected from the group consisting of a 1D-se FD OCT process (one dimensional spatially encoded Fourier Domain Optical Coherence Tomography process), a 1D-te FD OCT process (one dimensional time encoded Fourier Domain Optical Coherence Tomography process).

In an alternative embodiment, the optical coherence tomography process is a 1D-te TD OCT process (one dimensional time encoded Time Domain Optical Coherence Tomography process).

In yet a further alternative embodiment, the optical coherence tomography process is a 1D-se TD OCT process (one dimensional spatially encoded Time Domain Optical Coherence Tomography process) and In a further embodiment which relates to the 1D-se FD OCT process or the 1D-te FD OCT process, the spectrometer comprises a diffraction grating configured to expand the spectral distribution of the radiation reflected by the silicon wafer.

In an embodiment, the apparatus for monitoring comprises a housing, wherein at least the measuring head is arranged in the housing and wherein the housing comprises a window, the window being transparent for the light of the light source. The window is for example an infrared (IR) window. The housing is preferably waterproof.

The invention is further related to an apparatus for thinning a silicon wafer. The apparatus for thinning a silicon wafer comprises a system for removing at least a portion of a backside of the silicon wafer and the apparatus for monitoring according to one of the embodiments mentioned above.

An apparatus for thinning according to the invention may advantageously determine the thickness of the silicon wafer with high accuracy.

The system for removing comprises preferably a rotatable grinding wheel and a rotatable plate, the rotatable plate being configured to retain the silicon wafer.

The thinning apparatus may further comprise a control unit for the system for removing and a coupling unit, wherein the coupling unit is coupled to the evaluation device and to the control unit and wherein the control unit is configured to halt the system for removing when the determined thickness of the silicon wafer reaches a predetermined thickness. This embodiment advantageously provides a thinning apparatus which may reliably provide the ground silicon wafer having the predetermined thickness.

The coupling unit may be a part of the in-situ backside grinding process apparatus or of the control unit.

In a further embodiment, the control unit comprises a controller configured to adjust the rotation speed of the rotatable plate and/or the rotatable grinding wheel depending on the determined thickness of the silicon wafer. This allows for a control of the rotation speed of the rotatable plate and/or the rotatable grinding wheel.

The invention further relates to a method for monitoring a thickness of a silicon wafer with a highly-doped silicon layer at least at a backside of the silicon wafer, wherein the method comprises the steps of illuminating at least a portion of the silicon wafer with coherent light having multiple wavelengths with a bandwidth b about a central wavelength $w_c$. The limits of the bandwidth b are defined such that a wavelength for which an optical absorption coefficient of the highly-doped layer of the silicon wafer is a minimum lies within the bandwidth b. Moreover, the method comprises the step of determining a thickness of the silicon wafer by analyzing the radiation reflected by the silicon wafer using an optical coherence tomography process. The optical coherence tomography process may be one of those processes disclosed above.

This method according to the invention provides the advantages already mentioned in connection with the apparatus for monitoring which are not mentioned again in order to avoid repetition.

In an embodiment, the bandwidth b has limits that are defined such that the central wavelength $w_c$ is the wavelength for which an optical absorption coefficient of the highly-doped layer of the silicon wafer is a minimum.

The method may further comprise the steps of providing an apparatus for thinning a silicon wafer according to one of the embodiments mentioned above, attaching the silicon wafer to the apparatus for thinning, removing at least a portion of the backside of the silicon wafer, and stopping the removing step, wherein the steps of illuminating, receiving and determining are performed at least during the step of removing.

The method may further comprise the steps of inputting a dopant concentration of the highly-doped layer of the silicon wafer, and selecting the central wavelength $w_c$ to be the wavelength for which the optical absorption coefficient of the highly-doped layer of the silicon wafer having the selected dopant concentration is minimal.

In a further embodiment, the apparatus for thinning comprises a storage device with stored data of a dependence of the absorption coefficient of silicon on the dopant concentration and the central wavelength $w_c$ is selected using the data stored in the storage device.

The coherent light may be emitted from a spectral broadband light source which may be selected from the group consisting of a light-emitting diode, a semiconductor superluminescent diode (SLD) and an optically pumped fiber based amplified spontaneous emission (ASE) source, or from a tunable laser source which may be selected from the group consisting of an optically pumped photonic crystal laser and a semiconductor quantum dot tunable laser.

The central wavelength $w_c$ fulfills preferably the relation 950 nm $\leq w_c \leq$ 1150 nm. Moreover, the highly-doped layer of the silicon wafer comprises preferably silicon with a dopant concentration N, wherein $1*10^{19}$ cm$^{-3} \leq N \leq 1*10^{21}$ cm$^{-3}$.

In a further embodiment, a first predetermined thickness for the thickness of the silicon wafer is set and the removing step is stopped when the determined thickness of the silicon wafer reaches the first predetermined thickness.

The silicon wafer may have an active device region and a reinforcing rib region, the active device region having plural devices formed on a front side of the silicon wafer, the front side being opposite to the backside of the silicon wafer, wherein the reinforcing rib region is arranged at an outer circumferential edge of the silicon wafer. In this embodiment, the method further comprises the steps of setting a second predetermined thickness for the thickness of the active device region, wherein the second predetermined thickness is smaller than the first predetermined thickness, removing at least a portion of the backside of the active device region after the removing step such that the reinforcing rib region is formed to be thicker than an inside region of the silicon wafer comprising the active device region, illuminating at least a portion of the active device region with coherent light, and receiving at least a portion of radiation reflected by the active device region. The method further comprises the steps of determining a thickness of the active device region by analyzing the radiation reflected by the active device region using an optical coherence tomography process which may be selected from the group consisting of a 1D-se FD OCT process, a 1D-te FD OCT process, a 1D-se TD OCT process and a 1D-te TD OCT process, and stopping the second removing step when the determined thickness of the active device region reaches the second predetermined thickness. In this embodiment, strength is provided to the semiconductor waver by forming a thick rib on the outer circumferential edge of the silicon wafer. This may aid in preventing the breakage of the active device region containing the semiconductor devices.

The first predetermined thickness and/or the second predetermined thickness may be set in the coupling unit. Preferably, the first predetermined thickness and/or the second predetermined thickness are set by means of a touch screen of the coupling unit.

In a further embodiment which relates to the 1D-se FD OCT process or the 1D-te FD OCT process, the spectral distribution of the radiation reflected by the silicon wafer and/or by the active device region is expanded using a diffraction grating.

In a yet further embodiment, partial intensities $I(\lambda)$ of the radiation reflected by the silicon wafer and/or by the active device region are measured as a function of the wavelengths λ with an array of photodetectors in the spectrometer and a spectrum I'(1/λ) is calculated from the measured partial intensities I(λ) as a function of the inverted wavelengths.

In a further embodiment, the rotation speed of the rotatable plate and/or the rotatable grinding wheel is adjusted depending on the determined thickness of the silicon wafer and/or the determined thickness of the active device region.

In a further embodiment, the steps of removing, illuminating, receiving and determining are performed at each of a plurality of angular positions during a rotation of the silicon wafer, thereby determining a plurality of determined thicknesses for said rotation of the silicon wafer. In this embodiment, the method further comprises the steps of comparing at least two of the plurality of determined thicknesses, and determining if a difference between the at least two of the plurality of determined thicknesses surpasses a predetermined difference. This embodiment may be used to determine if wedging of the silicon wafer occurs during grinding and, if wedging occurs, to provide leveling information to the thinning apparatus, such that a grinding surface of the grinding wheel and/or a surface of the plate can be adjusted to reduce or eliminate wedging.

The invention further relates to the use of the apparatus for monitoring according to one of the mentioned embodiments for monitoring a thickness of a silicon wafer with a highly-doped silicon layer at least at a backside of the silicon wafer during a backside grinding process of the silicon wafer, wherein the highly-doped layer of the silicon wafer comprises silicon with a dopant concentration N, wherein $1*10^{19}$ $cm^{-3} \leq N \leq 1*10^{21}$ $cm^{-3}$.

The abstract of the disclosure is provided for the sole reason of complying with the rules requiring an abstract, which will allow a searcher to quickly ascertain the subject matter of the technical disclosure of any patent issued from this disclosure. It is submitted with the understanding that it will not be used to interpret or limit the scope or meaning of the claims.

Any advantages and benefits described may not apply to all embodiments of the invention. When the word "means" is recited in a claim element, Applicant intends for the claim element to fall under 35 USC 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC 112, paragraph 6.

What is claimed is:

1. An apparatus for monitoring a thickness of a silicon wafer with a highly-doped layer at least at a backside of the silicon wafer, the apparatus comprising:
   a light source configured to emit coherent light of multiple wavelengths,
   a measuring head configured to be contactlessly positioned adjacent the silicon wafer comprising the backside from which a portion is to be removed and configured to illuminate at least a portion of the silicon wafer with the coherent light of multiple wavelengths and configured to receive at least a portion of radiation reflected by the silicon wafer,
   a spectrometer configured to receive at least a portion of the radiation reflected by the silicon wafer and measure the partial intensities of the radiation reflected by the silicon wafer as a function of wavelength,
   a beam splitter coupled to the measuring head, the light source and the spectrometer,
   a selection device configured to select the central wavelength $W_c$ to be a wavelength for which an optical absorption coefficient of the highly-doped layer of the silicon wafer having the input dopant concentration is a minimum,
   an evaluation device configured to determine a thickness of the silicon wafer by analyzing the radiation reflected by the silicon wafer using an optical coherence tomography process,
   wherein the light source is configured to emit coherent light at multiple wavelengths with a bandwidth b around a central wavelength $W_c$, the bandwidth b having limits that are defined such that a wavelength for which an optical absorption coefficient of the highly-doped layer of the silicon wafer is a minimum lies within the bandwidth b,
   wherein the apparatus is an in-situ backside grinding process apparatus for monitoring a thickness of the silicon wafer during a backside grinding process and wherein the evaluation device is configured to determine the thickness of the silicon wafer by analyzing the radiation reflected by the silicon wafer during the backside grinding process, and
   further comprising an input device for inputting a dopant concentration of the highly-doped layer of the silicon wafer and wherein the apparatus is configured to select the central wavelength $W_c$ to be the wavelength for which the optical absorption coefficient of the highly-doped layer of the silicon wafer having the input dopant concentration is a minimum.

2. The apparatus of claim 1, wherein the bandwidth b has limits that are defined such that the central wavelength $w_c$ is the wavelength for which an optical absorption coefficient of the highly-doped layer of the silicon wafer is a minimum.

3. The apparatus of claim 1, further comprising a storage device with stored data of a dependence of the absorption coefficient on the dopant concentration and wherein the apparatus is configured to select the central wavelength $w_c$ using the data stored in the storage device.

4. The apparatus of claim 1, wherein $w_c$ is in the range of 950 nm $\leq w_c \leq$ 1150 nm and the highly-doped layer of the silicon wafer comprises silicon with a dopant concentration N, wherein N is in the range of $1*10^{19}$ $cm^{-3} \leq N \leq 1*10^{21}$ $cm^{-3}$.

5. The apparatus of claim 4, wherein the spectral broadband light source is selected from the group consisting of a light-emitting diode, a semiconductor superluminescent diode (SLD) and an optically pumped fiber based amplified spontaneous emission (ASE) source, or wherein the tunable laser source is selected from the group consisting of an optically pumped photonic crystal laser and a semiconductor quantum dot tunable laser.

6. The apparatus of claim 1, wherein the light source is a spectral broadband light source or a tunable laser source.

7. The apparatus of claim 1, wherein the optical coherence tomography process is selected from the group consisting of a 1D-se FD OCT process (one dimensional spatially encoded Fourier Domain Optical Coherence Tomography process), a 1D-te FD OCT process (one dimensional time encoded Fourier Domain Optical Coherence Tomography process).

8. The apparatus of claim 1, wherein the optical coherence tomography process is a 1D-te TD OCT process (one dimensional time encoded Time Domain Optical Coherence Tomography process).

9. The apparatus of claim 1, wherein the optical coherence tomography process is a 1D-se TD OCT process (one dimensional spatially encoded Time Domain Optical Coherence Tomography process).

10. The apparatus of claim 1, wherein the beam splitter is an optical coupler.

11. The apparatus of claim 10, further comprising:
at least one first optical waveguide, the at least one first optical waveguide coupling the measuring head to the optical coupler,
at least one second optical waveguide, the at least one second optical waveguide coupling the optical coupler to the light source,
at least one third optical waveguide, the at least one third optical waveguide coupling the optical coupler to the spectrometer.

12. The apparatus of claim 1, wherein the spectrometer comprises a diffraction grating configured to expand the spectral distribution of the radiation reflected by the silicon wafer.

13. The apparatus of claim 1, further comprising a housing, wherein at least the measuring head is arranged in the housing and wherein the housing comprises a window being transparent for the light of the light source.

14. A system for thinning a portion of a highly-doped side of a silicon wafer, the system comprising:
a thinning apparatus for removing a portion of the silicon wafer, the thinning system comprising:
a rotatable grinding wheel,
a grinding motor coupled to the grinding wheel and configured for selectively rotating the grinding wheel about a first rotational axis,
a rotatable plate configured to retain the silicon wafer, a plate motor coupled to the rotatable plate,
a control unit configured to halt the grinding wheel motor and the plate motor when silicon wafer reaches a predetermined thickness,
a monitoring apparatus in communication with the control unit, the monitoring apparatus comprising
a light source configured to emit coherent light of multiple wavelengths,
a measuring head configured to be contactlessly positioned adjacent the silicon wafer comprising the backside from which a portion is to be removed and configured to illuminate at least a portion of the silicon wafer with the coherent light of multiple wavelengths and configured to receive at least a portion of radiation reflected by the silicon wafer,
a spectrometer configured to receive at least a portion of the radiation reflected by the silicon wafer and measure the partial intensities of the radiation reflected by the silicon wafer as a function of wavelength,
a beam splitter coupled to the measuring head, the light source and the spectrometer,
a selection device configured to select the central wavelength $W_c$ to be a wavelength for which an optical absorption coefficient of the highly-doped layer of the silicon wafer having the input dopant concentration is a minimum,
an evaluation device configured to determine a thickness of the silicon wafer by analyzing the radiation reflected by the silicon wafer using an optical coherence tomography process, wherein the light source is configured to emit coherent light at multiple wavelengths with a bandwidth b around a central wavelength $W_c$, the bandwidth b having limits that are defined such that a wavelength for which an optical absorption coefficient of the highly-doped layer of the silicon wafer is a minimum lies within the bandwidth b, and
an input device for inputting a dopant concentration of the highly-doped layer of the silicon wafer and wherein the monitoring apparatus is configured to select the central wavelength $W_c$ to be the wavelength for which the optical absorption coefficient of the highly-doped layer of the silicon wafer having the input dopant concentration is a minimum.

15. The apparatus according to claim 14, further comprising a coupling unit, wherein the coupling unit is coupled to the evaluation device and to the control unit and wherein the control unit is configured to halt the system for removing when the determined thickness of the silicon wafer reaches a predetermined thickness.

16. The apparatus of claim 15, wherein the coupling unit is a part of the in situ backside grinding process apparatus.

17. The apparatus of claim 15, wherein the coupling unit is a part of the control unit.

18. The apparatus of claim 15, wherein the control unit comprises a controller configured to adjust the rotation speed of the rotatable plate and/or the rotatable grinding wheel depending on the determined thickness of the silicon wafer.

19. A method for monitoring and adjusting a thickness of a silicon wafer with a highly-doped layer at least at a backside of the silicon wafer, the method comprising:
illuminating at least a portion of the silicon wafer with coherent light comprising multiple wavelengths with a bandwidth b around a central wavelength $w_c$, the bandwidth b having limits that are defined such that a wavelength for which an optical absorption coefficient of the highly-doped layer of the silicon wafer is a minimum lies within the bandwidth b,
receiving at least a portion of radiation reflected by the silicon wafer, and
determining a thickness of the silicon wafer by analyzing the radiation reflected by the silicon wafer using an optical coherence tomography process whilst removing a portion of the backside of the silicon wafer, and
inputting a dopant concentration of the highly-doped layer of the silicon wafer, and
selecting the central wavelength $w_c$ to be the wavelength for which the optical absorption coefficient of the highly-doped layer of the silicon wafer having the input dopant concentration is minimal.

20. The method of claim 19, wherein the bandwidth b has limits that are defined such that the central wavelength $w_c$ is the wavelength for which an optical absorption coefficient of the highly-doped layer of the silicon wafer is a minimum.

21. The method of claim 19, further comprising:
providing an apparatus for thinning a silicon wafer,
attaching the silicon wafer to the apparatus for thinning,
removing at least a portion of the backside of the silicon wafer, and
stopping the removing step,
wherein the steps of illuminating, receiving and determining are performed at least during the step of removing.

22. The method of claim 19, wherein the silicon wafer is illuminated with coherent light emitted from a spectral broadband light source or a tunable laser source.

23. The method of claim 19, wherein
the thickness of the silicon wafer is determined using the optical coherence tomography process selected from the group consisting of a 1D-se FD OCT process (one dimensional spatially encoded Fourier Domain Optical Coherence Tomography process), a 1D-te FD OCT process (one dimensional time encoded Fourier Domain Optical Coherence Tomography process).

24. The method of claim 19, wherein
the thickness of the silicon wafer is determined using the optical coherence tomography process is a 1D-te TD OCT process (one dimensional time encoded Time Domain Optical Coherence Tomography process).

25. The method of claim 19, wherein
the thickness of the silicon wafer is determined using the optical coherence tomography process is a 1D-se TD OCT process (one dimensional spatially encoded Time Domain Optical Coherence Tomography process).

26. The method of claim 19, wherein the apparatus for thinning comprises a storage device with stored data of a dependence of the absorption coefficient on the dopant concentration and wherein the central wavelength $w_c$ is selected using the data stored in the storage device.

27. The method of claim 19, wherein the portion of the silicon wafer is illuminated using a light-emitting diode, a semiconductor superluminescent diode (SLD), an optically pumped fiber based amplified spontaneous emission (ASE) source, an optically pumped photonic crystal laser or a semiconductor quantum dot tunable laser.

28. The method of claim 19, wherein 950 nm≤$w_c$≤1150 nm.

29. The method of claim 19, wherein the highly-doped layer of the silicon wafer comprises silicon with a dopant concentration N, wherein $1*10^{19}$ cm$^{-3}$≤N≤$1 10^{21}$ cm$^{-3}$.

30. The method of claim 19, wherein a first predetermined thickness for the thickness of the silicon wafer is set and wherein the removing step is stopped when the determined thickness of the silicon wafer reaches the first predetermined thickness.

31. The method of claim 30, wherein the first predetermined thickness and/or the second predetermined thickness are set in the coupling unit.

32. The method of claim 31, wherein the first predetermined thickness and/or the second predetermined thickness are set by means of a touch screen of the coupling unit.

33. The method of claim 19, wherein the silicon wafer has an active device region and a reinforcing rib region, the active device region having plural devices formed on a front side of the silicon wafer, the front side being opposite to the backside of the silicon wafer, and wherein the reinforcing rib region is arranged at an outer circumferential edge of the silicon wafer and wherein the method further comprises the steps of:
setting a second predetermined thickness for the thickness of the active device region,
removing at least a portion of the backside of the active device region,
illuminating at least a portion of the active device region with the coherent light,
receiving at least a portion of radiation reflected by the active device region,
determining a thickness of the active device region by analyzing the radiation reflected by the active device region using an optical coherence tomography process,
stopping the second removing step when the determined thickness of the active device region reaches the second predetermined thickness.

34. The method of claim 19, wherein the spectral distribution of the radiation reflected by the silicon wafer is expanded using a diffraction grating.

35. The method of claim 19, wherein partial intensities I(λ) of the radiation reflected by the silicon wafer are measured as a function of the wavelengths λ with an array of photodetectors in the spectrometer and a spectrum I'(1/λ) is calculated from the measured partial intensities I(λ) as a function of the inverted wavelengths.

36. The method of claim 19, wherein a rotation speed of a rotatable plate and/or a rotatable grinding wheel are adjusted depending on the determined thickness of the silicon wafer.

37. The method of claim 19, further comprising the steps of:
performing the steps of removing, illuminating, receiving and determining at each of a plurality of angular positions during a rotation of the silicon wafer, thereby determining a plurality of determined thicknesses for said rotation of the silicon wafer,
comparing at least two of the plurality of determined thicknesses, and
determining if a difference between the at least two of the plurality of determined thicknesses surpasses a predetermined difference.

\* \* \* \* \*